United States Patent [19]
Haruta

[11] Patent Number: 6,087,713
[45] Date of Patent: Jul. 11, 2000

[54] PLASTIC PACKAGE, SEMICONDUCTOR DEVICE, AND METHOD OF MANUFACTURING PLASTIC PACKAGE

[75] Inventor: Koichi Haruta, Yamaguchi-ken, Japan

[73] Assignee: Mitsui Chemicals, Inc., Tokyo, Japan

[21] Appl. No.: 09/047,413

[22] Filed: Mar. 25, 1998

[30] Foreign Application Priority Data

Mar. 25, 1997 [JP] Japan ................................. 9-071837

[51] Int. Cl.⁷ .................................................. H01L 23/495
[52] U.S. Cl. ............................................ 257/666; 257/677
[58] Field of Search ................................... 257/666, 677, 257/735, 739, 783

[56] References Cited

U.S. PATENT DOCUMENTS 5,359,222  10/1994  Okutomo et al. .
5,559,364   9/1996  Hojyo et al. .
5,742,096   4/1998  Lee .
5,859,471   1/1999  Karaishi et al. .
5,898,212   4/1999  Kim .

FOREIGN PATENT DOCUMENTS 855927  2/1996  Japan .

*Primary Examiner*—Sheila V. Clark
*Attorney, Agent, or Firm*—Birch, Stewart, Kolasch & Birch, LLP

[57] ABSTRACT

Disclosed is a plastic package for storing a chip, the plastic package being further improved in moisture resistance and reduced in manufacturing costs. The plastic package comprises a plastic package body for storing a chip and a lead electrically connected with the chip, wherein an oxide layer is formed on the surface of a part of the intermediate portion of the lead, the part of the intermediate portion being allowed to adhere to a plastic.

18 Claims, 3 Drawing Sheets

PLASTIC PACKAGE, SEMICONDUCTOR DEVICE, AND METHOD OF MANUFACTURING PLASTIC PACKAGE

BACKGROUND OF THE INVENTION

1. Field of the Invention

This invention relates to a plastic package for packaging a element, e.g. IC, CCD (charge coupled device). More particularly, to a plastic package possessing excellent moisture resistance.

2. Description of the Related Art

A resin package is used for packaging a chip in a semiconductor device. A hollow package comprises a box molded product made of plastic with a lead inserted therein, a semiconductor chip is secured to the internal bottom of the molded product, and a transparent or semitransparent cover called "lid" is used to seal an upper opening of the molded product, thereby fabricating a semiconductor device. This hollow package is a type of plastic package.

Semiconductor devises are used by incorporating it into electronic products such as a video camera. Therefore, strict moisture resistance is required for such a semiconductor device so that a semiconductor chip stored in electronic products always works in a normal manner. For that, the hollow package which corresponds to a container in a semiconductor device necessarily has excellent moisture resistance for a long period of time such that it can withstand a severe test such as a pressure cooker test.

Improvements in plastic compositions constituting the resin package body have been made to raise the level of the moisture resistance of the hollow package. For instance, there has been a trial to convert the chemical structure of an epoxy resin to various modified structures from the basic structures such as a novolak type, bisphenol type, or the like. However, this trial unnecessarily satisfies improvements in the moisture resistance. Also, other ingredients constituting the plastic composition, for example, a mold release agent for improving the releasability from a metal mold and various fillers added to control the coefficient of thermal expansion and the heat conductivity can insufficiently contribute to the improvement in the moisture resistance of the hollow package even if the sorts or amounts of these are adjusted.

In order to solve these problems, a trial is made in Japanese Patent Application Laid-Open (JP-A) No. 8-55927 which describes "As a result of various studies to improve the moisture resistance of a hollow package, it has been found that there is the cause controlling the moisture resistance of the hollow package in the condition of the boundary between a lead and a plastic layer. Specifically, it was clarified that a hollow package which has adhesiveness between the lead and the plastic layer can be obtained with an increase in moisture resistance in long time use". Based on these fact, Japanese Patent Application Laid-Open (JP-A) No. 8-55927 discloses a hollow package comprising a plastic package body having a concave portion for storing a chip; and a lead including one end extending to the concave portion, the other end protruding from the package body, and an intermediate portion embedded in the package body, the one end being electrically connected with the semiconductor element, wherein the intermediate portion of the lead is formed so as to have a roughened face. This structure results in achieving a relatively long durability in terms of a durable time in pressure cooker test as long as 14 hours.

The rough face is formed in the intermediate portion of the lead by a sand blast method in which the intermediate portion of the lead is processed by air blast using alumina micropowder to form a rough face on the lead.

Such a sand blast method for forming the rough face on the lead, however, has the problem that it requires troublesome operations for sufficiently removing alumina micropowder attached to the surface of the lead. This method also has the drawback of non-uniformity of the roughened face condition caused by the accumulation of polished powder on the surface of a metal mask used for a lead frame. Further, this method imparts cost problems including a great cost of expendable supplies such as a metal mask for lead frame, alumina polishing powder, and the like and a great maintenance cost associated with the troubles of a sand blast apparatus itself, a compressor, or the like caused by the polishing powder.

On the other hand, there is a greatly increased demand for the provision of the moisture resistance of the hollow package in a semiconductor device including a CCD. It is required in practice to achieve an increase in durable time in a pressure cooker test. It is also required to develop a new process for manufacturing an inexpensive hollow package having excellent moisture resistance since there are exacting demands of a more inexpensive hollow package.

SUMMARY OF THE INVENTION

It is an object of the present invention to provide a plastic package which is inexpensive and is improved in moisture resistance.

According to a first aspect of the present invention, there is provided a plastic package comprising: a plastic package body for storing a chip; a lead member having one end extending to the inside of the package body, the other end protruding from the package body, and an intermediate portion embedded in the package body, the one end being to be electrically connected with the chip; and an oxide layer formed on a part of the surface of the intermediate portion in the lead member so as to have a thickness greater than thickness of an oxide layer formed on the remainder part of the lead member.

The use of the plastic package having such a structure allows the adhesion between the lead member and the plastic package body to be improved, whereby a plastic package having a higher moisture resistance than that of conventional plastic packages can be provided.

According to another aspect of the present invention, there is provided a resin package comprising: a plastic package body for storing a chip; a lead member having one end extending to the inside of the package body, the other end protruding from the package body, an intermediate portion embedded in the package body, the one end being to be electrically connected with the semiconductor chip; and an irregular portion having cyclical irregularities formed at a pitch of 10 to 100 μm on the surface of the intermediate portion of the lead member, the irregular portion having a length of 0.1 mm or more in a longitudinal direction of the lead member.

In this structure in which an irregular portion is formed on the surface of the intermediate layer of the lead member, the adhesion between the lead member and the plastic package body is improved, which ensures the provision of a plastic package having a more excellent moisture resistance than those of conventional plastic packages.

According to a further aspect of the present invention, there is provided a semiconductor device comprising a chip stored in the plastic package of the types described above.

A semiconductor device having a higher moisture resistance than that of conventional plastic packages can be provided by adopting such a structure. Here, solid state imaging devices are preferably used as the chip and, among these, a CCD is preferable.

According to a still further aspect of the present invention, there is provided a process for manufacturing a plastic package comprising: a step of irradiating pulsed laser beams to an intermediate portion of a lead member of which one end is to be electrically connected with a chip, while it is scanned, to form an oxide layer on the intermediate portion of the lead member; and a step of molding the lead member and a plastic monolithically to make the intermediate portion of the lead member buried in the plastic while externally protruding the other end of the lead member from the plastic.

If the plastic package is manufactured by such a process, only a portion required to be treated is selectively treated without providing the masking or the like on the subject in a different way from the sand blast method, thereby enabling a-manufacturing process to be more simplified than conventional processes.

BRIEF DESCRIPTION OF THE DRAWINGS

Other objects and advantages of the present invention will become apparent during the following discussion conjunction with the accompanying drawings, in which.

DETAILED DESCRIPTION OF THE PREFERRED EMBODIMENT

The present invention will now be explained in detail with reference to the drawings.

The plastic package of the present invention comprises a plastic package body for storing a semiconductor chip and a lead which is to be electrically connected with each electrode of the semiconductor chip.

(1) Structure of a plastic package

As the plastic package, those having a structure of a lead mounting system or a surface mounting system may be used. However, the present invention has the most effect on a structure called a hollow package comprising a plastic package body having a cavity and leads molded monolithically with the plastic package body.

Figure 1:
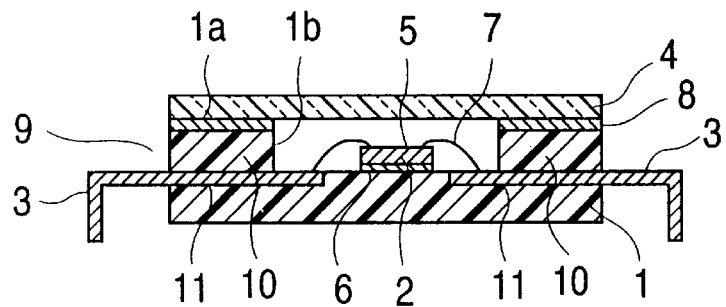
FIG. 1 is a schematically sectional view showing an example of a plastic package of an embodiment according to the present invention.

FIG. 1 is a schematically sectional view showing an example of a plastic package of an embodiment according to the present invention. A plastic package 9 comprises a box plastic package body 1 and a lead 3 (a lead member). A chip is stored in the plastic package and a lid is used to close the plastic package and thereby to manufacture a semiconductor device in which the semiconductor chip is sealed in the plastic package. In the concrete, the plastic package body 1 is provided with a concave portion 5 for storing the semiconductor chip 2 in the center thereof. The chip 2 is secured within the concave portion 5 using an adhesive 6. Each electrode (not shown) of the chip 2 is electrically connected with the lead 3 via a bonding wire 7. A lid 4 is secured to the upper surface 1a of the plastic package body 1 to close an upper opening 1b of the plastic package body 1. The lead 3 is integrated with the plastic package body 1 to form a molded product as the plastic package of the present invention.

There are no limitations to a process for manufacturing such a plastic package. For example, the plastic package body 1 can be produced by transfer molding or injection molding. At this time, the lead 3 is inserted into a metal mold in advance prior to the molding and plastic is then injected and cured or solidified to produce a plastic package.

Figure 2:
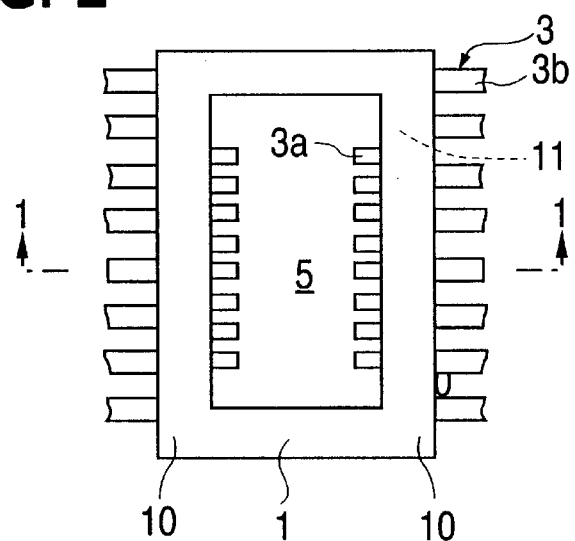
FIG. 2 is a schematically top plan view of the plastic package of an embodiment according to the present invention.

FIG. 2 is a top plan view of a plastic package 9 viewed from the side of the upper opening 1b. The lead 3 is embedded into the plastic package body 1, one end (an inner lead 3a) of the lead 3 extends to the inside of the plastic package body and is to be electrically connected with the chip 2, and the other end of the lead 3 (an outer lead 3b) to be externally connected protrudes from the plastic package body 1 and is exposed. In this condition, an intermediate portion 11 defined between the inner lead 3a and the outer lead 3b is embedded into the plastic package body 1, specifically, a plastic layer 10 constituting the plastic package body 1.

Accordingly, the intermediate portion 11 of the lead 3 is secured within the plastic layer 10 whereby the lead 3 is secured with the position thereof being fixed. Then, the lead 3 is electrically connected with the chip 2 via the inner lead 3a.

(2) Plastic package body

Examples of materials used as the structure of the resin package body 1 include heat curable resins such as an epoxy resin, polyimide resin, phenol resin, unsaturated polyester resin, silicone resin, and the like or heat resistant thermoplastic resins such as a liquid crystal polymer, polyphenylene oxide, polyphenylene sulfide (PPS) resin, polysulfone, polyamide/imide, polyarylsulfone resin, and the like. Among these, an epoxy resin, polyimide resin, PPS, and the like are preferable.

An inorganic filler such as alumina powder, silica powder, silicon nitride powder, boron nitride powder, titanium oxide powder, silicon carbonate powder, glass fiber, alumina fiber, or the like may be added to each of these heat resistant resins. Other than the inorganic filler, other additives such as a curing agent, hardening accelerator, coupling agent, and the like may be included, if necessary.

(3) Lead

Examples of materials used as the lead 3 include iron-based alloys such as an iron-nickel, e.g. 42 alloy, iron-nickel-chrome, iron-nickel-cobalt, and the like, or copper-based alloys containing several metals selected from the group consisting of magnesium, silicon, phosphorus, titanium, chromium, nickel, zinc, tin, and zirconium. Besides, metals or alloys ordinary used as a lead material may be used.

The present invention is featured in that, in the lead 3, at least a part of the portion adhering to the plastic package body 1 is formed with an oxide layer or an irregular portion having cyclic irregularities formed at a pitch of 10 to 100 µm. The oxide layer and the irregular portion and methods for forming these will be explained.

Figure 3:
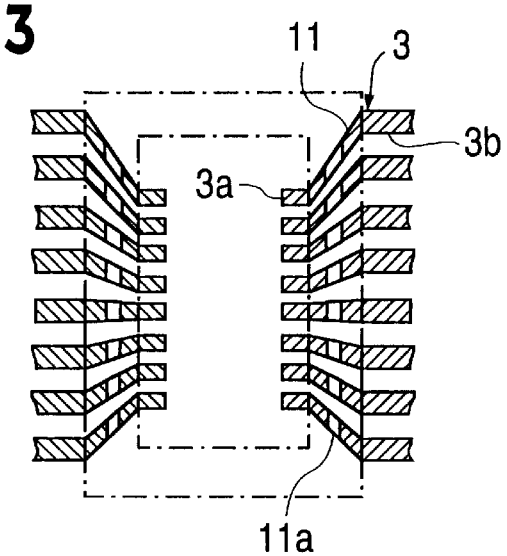
FIG. 3 is a schematically top plan view of a lead constituting a part of the plastic package of an embodiment according to the present invention.

FIG. 3 is a top plan view of the lead 3. In FIG. 3, an oxide layer 11a is formed on the surface of the intermediate portion 11 of the lead 3, specifically at the portion adhering to the plastic layer. The oxide layer 11a is required to be formed on at least a part of the intermediate portion 11 of the lead 3. As shown in FIG. 3, it is desirable that the oxide layer 11a be formed along the lengthy side of the box plastic package body 1 so as to traverse the intermediate portion 11 of each lead. The oxide layer 11a is formed on the intermediate portion 11 of the lead 3 in this manner, whereby the lead 3 is firmly fixed to the plastic. Thus, an admission passage for water through the boundary between the lead and the plastic can be perfectly shut.

The oxide layer must be formed on at least a part of the surface of the intermediate portion 11 of the lead 3. In this case, the oxide layer may be formed either on one or both of the surfaces of the lead 3 though the provision of the oxide layer formed on the both surfaces imparts a more excellent moisture resistant effect.

If, portions other than the intermediate portion 11 of the lead 3, specifically, the inner lead 3a to be wire-bonded with the chip 2 or the outer lead 3b to be connected with an external circuit is intentionally formed with an oxide layer, a burr is stuck to the surface of the inner lead 3a or outer lead 3b when the plastic package body 1 is molded. In this case, the burr can be perfectly removed only with difficulty even in the succeeding washing step whereby there is the case where the bonding force with the bonding wire 7 or other wires is decreased. Therefore, it is desirable that only the intermediate portion 11 of the lead 3 be formed with an oxide layer.

Here, the oxide layer means a layer composed of an oxide of a metal or non-metal and having a thickness of the fixed order or more and there are no limitations to the oxide layer except that it is obtained by the treatment on the surface of the lead. It is noted that the oxide layer does not include a surface oxide layer formed by natural oxidation of a metal constituting the lead (this surface oxide layer is hereinafter called "a natural oxide layer").

As a material used for the oxide layer, it is desirable to use a metal oxide prepared from at least one of metal materials forming the lead 3. Such a metal oxide is, specifically, prepared by oxidizing the surface of the lead 3. Illustrating specific examples of such a metal oxide, the oxide is iron oxide and/or nickel oxide in case of using a 42 alloy as a material of the lead 3. An oxide of other metals or non-metals which are chemically stable and highly adhesive to a material used for the lead may be used. It is particularly preferable to use iron oxide as the oxide layer.

The thickness of the oxide layer is not required to be uniform. The thickness of at least a part of the oxide layer is preferably from 5 to 500 nm and more preferably from 10 to 500 nm. When the thickness is in a range from 50 to 500 nm, the highest effect of the present invention can be imparted. It is also desirable that at least one position of the oxide layer of the intermediate portion has a thickness of 1.5 to 500 times that of a natural oxide layer formed on the surfaces other than the intermediate portion. The oxide layer is desirable to be formed from one edge to the other edge of the lead in a direction transversely to the intermediate portion of the lead. And it is also desirable that the oxide layer is formed with a length of 0.1 mm or more in the longitudinal directions of the lead. But, the oxide layer should not always be formed on the whole area above described.

It is considered that at least a part of the surface of the lead is formed with the oxide layer having the above thickness to improve the adhesion between the lead and the plastic though the true reason has not been clarified.

If the oxide layer is further provided with microparticles of a metal oxide with a particle diameter of 10 nm to 2 μm on the surface thereof, the oxide microparticle acts as an anchor to improve the adhesion between the lead and the plastic. Also, the particle diameter of the oxide microparticles is desirably from 50 nm to 1 μm.

As a method for forming the oxide layer on the lead, a thermal method including laser irradiation, electron beam irradiation, plasma processing, high frequency induction heating, electric discharge machining, flame treatment, or the like can be used. Other methods including PVD (physical vapor deposition) and CVD (chemical vapor deposition) may be used to form the oxide layer on the surface of the lead though the above thermal method is suitable in view of ease of the steps of manufacturing the plastic package. Since the lead has a figure of an extremely thin plate with a thickness of 0.1 to 0.3 mm and is formed of a material of an iron alloy or copper alloy, it is important that the heat input by heat treatment is reduced to decrease a warp of the lead. Therefore, it is effective to use a high density heat source, e.g. laser irradiation. Incidentally, in the case where the oxide layer is formed on the surface of the lead by laser irradiation, it is considered that microparticles of metal oxide formed through the evaporation and scatter of a metal material forming the lead will be accumulated on and stuck to the portion exposed to laser beam on the lead.

The intermediate portion 11 of the lead 3 shown in FIG. 3 may be formed with an irregular portion having cyclic irregularities formed in one direction at a pitch of 10 to 100 μm instead of the oxide layer. The irregular portion can be prepared by roughly processing the surface of the lead so as to provide the surface with cyclic irregularities. When the intermediate portion of the lead is formed with such an irregular portion, the adhesion between the lead and the plastic is improved due to an anchor effect. The pitch and the surface roughness ($R_{max}$) of the irregular portion are considered to contribute to the adhesion between the lead and the resin.

It is more desirable that the pitch of the irregular portion be from 25 to 100 μm. The $R_{max}$ is desirably in a range from 1 to 100 μm. The maximum effect can be obtained when the pitch is in a range from 30 to 50 μm and the $R_{max}$ is in a range from 3 to 20 μm. The irregular portion is required to be formed with a length of 0.1 mm in a longitudinal direction of the lead 3 on one of the surfaces of the intermediate portion 11 of the lead 3. And the irregular portion is desirable to be formed from one edge to the other edge of the lead in a direction transversely to the intermediate portion 11. If the irregular portion is formed on both surfaces of the lead 3, a more increased effect can be obtained.

Methods in which the lead 3 is treated by laser irradiation or etching are exemplified as the method for forming the irregular portion on the lead 3. Laser irradiation on the lead 3 is suitable in view of ease of the process of manufacturing the plastic package.

It is noted that both of the aforementioned surface oxide layer and irregular portion may be formed on the intermediate portion 11 of the lead 3. For example, an oxide layer with a thickness of 5 to 500 nm may be further formed on the irregular portion formed on the intermediate portion 11.

When the oxide layer and/or the irregular portion is formed on the surface of the lead 3 made of an iron-based alloy of an extremely thin plate shape or the like by laser irradiation, it is desirable to use laser radiation at wavelengths ranging within the wave length band of near infrared radiation. As the laser radiation of wavelengths corresponding to those of near infrared radiation, which can maintain the shape of the lead and form an oxide layer on the lead, solid-state laser, e.g. alexandrite, YAG may be used.

The wavelength of the laser radiation, which lies in the wavelength band of near infrared radiation, is desirably near 1 µm which allows the laser radiation to be decreased in energy reflectance of a metal and increased in energy absorption rate. If pulsed laser radiation is used as such a laser radiation, cyclic irregularities can be easily formed in one direction. Laser radiation having a wavelength of 1.06 µm emitted from Q-switched Nd:YAG laser is most suitable to satisfy these requirements. When Q switch-type Nd:YAG laser is used, the power range, which allows an oxide layer to be formed on the lead without deformation of the lead, is preferably from 15 W to 50 W at a working spot. A desirable frequency of Q switch is in a range from 2 to 20 kHz, preferably from 2 to 8 kHz, and more preferably from 4 to 7 kHz so that laser radiation is emitted in a stable manner and the adhesion between the lead and the plastic is improved. The surface of the lead is irradiated with laser beams in these conditions whereby an oxide layer as well as an irregular portion can be formed on the surface of the lead and hence more desirable effect can be obtained.

If a galvanomiller-scanning method using a f-θ lens-system is used for aligning laser beam when laser radiation is applied, the surface oxide layer and/or the irregular portion can be easily formed on only necessary positions of the lead surface. For example, the pulsed laser beam with the spot size of 80 µm on the irradiated portion irradiates the surface of the lead while scanning across the intermediate portion of the lead in the above mentioned frequency. Then, the laser beam irradiates another part of the lead at intervals of 0.1 mm through 0.5 mm from the already irradiated part. This operation is repeated for several times until the intermediate portion of the lead to be irradiated is fully irradiated. Thus, irradiated lines are obtained on the part where the pulsed laser beams are irradiated. The number of repeating time of the operation may be one or more, and the number becomes larger, the effect of the invention becomes larger. Therefore, processes and jigs, which are required in the conventional sandblast method, specifically, pretreatment for masking, in advance, the portions (inner lead 3a, outer lead 3b, and the like) which is not required to be roughly processed and jigs used in the pretreatment are unnecessary at all thereby saving costs of expendable supplies.

EXAMPLES

A preliminary test was performed in advance according to the following method to examine the effects of an oxide layer and irregular portion formed on a lead.
(Experiment 1)

Figure 4:
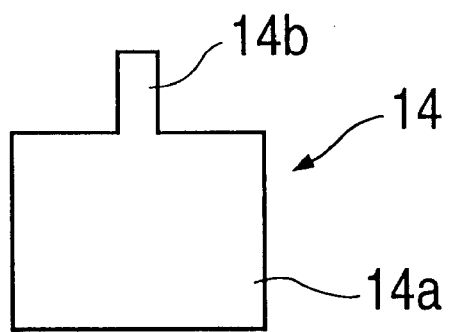
FIG. 4 is a top plan view of a metal plate used in a preliminary test of examples.

Firstly as shown in FIG. 4, a metal plate 14, made of a 42 alloy having a thickness of 0.25 mm with a projecting strip 14b with a narrow width projecting from one end of a rectangular base 14a, was surface-treated in varied conditions to prepare four types of metal plate. The surface treatment was performed on an almost entire of both the surface of the projecting strip 14b according to the following methods.

Surface treating method A: the sample was irradiated with laser beams from a Q-switched YAG laser irradiation apparatus, which delivered a rated power of 50 W, in the following conditions: wave length: 1.06 µm, frequency of Q switch: 6 kHz, beam scanning velocity: 200 mm/sec, aperture: fully opened, laser power at the position 100 mm below the working spot: 22.2 W, and spot size on the irradiated portion: 80 um. The laser irradiation is applied by beam scanning on the projecting strip 14b at intervals of 0.15 mm until the portion to be treated in the projecting strip 14b is fully irradiated.

Surface treating method B: the sample was air-blasted using a sandblast apparatus by blowing alumina powder having an average particle diameter of 14 µm from a nozzle having a diameter of 3.0 mm under an air pressure of 5 $Kg/cm^2$G at a feed rate of 18 mm/sec.

Surface treating method C: the sample was irradiated with laser beam from a Q-switched YAG laser irradiation apparatus, which delivered a rated power of 50 W, in the following conditions: wave length: 1.06 µm, frequency of Q switch: 12 kHz, beam scanning velocity: 200 mm/sec, aperture: fully opened, laser power at the position 100 mm below the working spot: 22.2 W, and spot size on the irradiated portion: 80 µm. The laser irradiation is applied by beam scanning on the projecting strip 14b at intervals of 0.15 mm until the portion to be treated in the projecting strip 14b is fully irradiated.

Surface treating method D: no treatment.

Next, the top ends of the projecting strips 14b of the metal plates 14 respectively treated by the above surface treating methods A to D were inserted into a metal mold 12 for preparing a specimen used in a pull-out test and were molded using a transfer molding machine by injecting an epoxy resin and pressing at 165° C. under a pressure of 120 $Kg/cm^2$ for two minutes. The resulting molded products were used as test specimens.

The pull-out adhesion (Kg) between the metal plate and the epoxy resin layer was measured using a tensile tester (Tensilon UCT-5T) at a tension speed of 5 mm/min. Five samples every test specimen were evaluated to determine an average adhesion of five samples as the pull-out adhesion of the test specimen. A dimension of one surface of embedded parts of the each projecting strip 14b is 4 mm width and 5 mm length in the test direction. The results are shown in Table 1.

As shown in Table 1, a result was obtained in which the test specimen treated by the surface treating method A (hereinafter simply abbreviated as "test specimen A", similarly in cases of surface treating methods B to D) exhibited the highest pull-out adhesion. As for the test specimen C, the same pull-out adhesion as that of the test specimen B could be obtained. Therefore, it was confirmed that the surface treatment of the lead using laser radiation was effective.

TABLE 1

| Surface treating method | A | B | C | D |
|---|---|---|---|---|
| Pull-out adhesion (Kg) | 32.0 | 14.8 | 13.5 | 4.1 |

(Experiment 2)

A lead frame plate, in which twelve leads 3 shown in FIG. 3 were connected each other, was prepared and both surfaces of the intermediate portion 11 of each of leads 3 were treated by the same treating methods A to D as in Experiment 1. In the surface treating method B, the inner lead 3a and the outer lead 3b were masked with a jig or a seal tape and the exposed intermediate portion 11 was treated by sandblast. In the surface treating methods A and C, only the intermediate portion 11 was irradiated with laser radiation by means of laser beam scanning. Then, the lead frame treated by the surface treating methods A to D was molded using a transfer molding equipment to obtain a hollow plastic package made of an epoxy resin shown in FIG. 2. This plastic package was covered and sealed with a glass lid using an epoxy resin adhesive and was subjected to a pressure cooker test. In the pressure cooker test, the sample was allowed to stand in a steamy atmosphere at 121° C. under an humidity of 100% for a prescribed period of time and was then placed in a thermostat at 25° C. for 30 minutes to observe the occurrence of clouding on the glass lid. The number of samples was 10 and an average time passage until clouding occurred was defined as a durable time. The results are shown in Table 2. The moisture resistance was determined as better with an increase in durable time.

Similarly to Experiment 1, the best result was obtained in the surface treating method A and, in the surface treating method C, the same result as in the sandblast method (surface treating method B) was obtained.

TABLE 2

| Surface treating method | A | B | C | D |
|---|---|---|---|---|
| Durable time (hrs) | 20.1 | 14.0 | 13.2 | 4.3 |

(Experiment 3)

Figure 5:
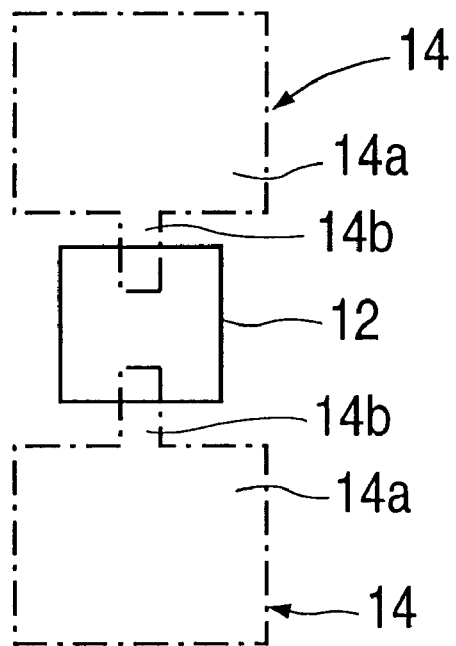
FIG. 5 is a top plan view of a metal mold for manufacturing a test specimen used in a preliminary test of examples.
Figure 6:
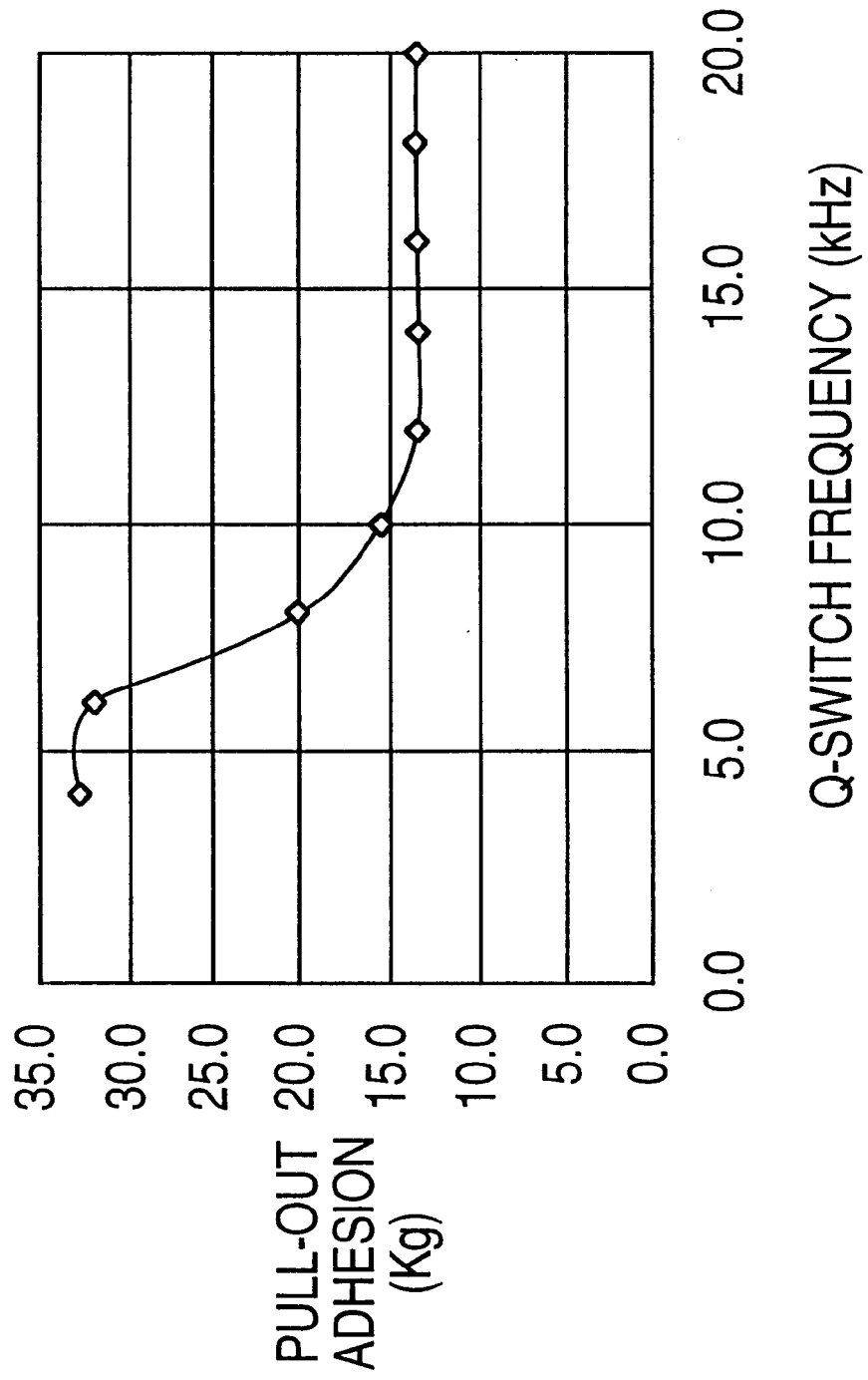
FIG. 6 is a graph showing a result of the Q switch-frequency dependency of pull-out adhesion in examples.

The test specimen (see FIG. 5) used in Experiment 1 was surface-treated at varied frequencies of the Q switch to examine the Q switch frequency dependency of the pull-out adhesion. An average value of five samples was defined as the pull-out adhesion of the test specimen. The results are shown in FIG. 6. The pull-out adhesion as well as the durable time largely varied above the borderline of a frequency of 6 to 8 kHz and it was confirmed that the durable time was best at frequencies 7 kHz or less.

(Experiment 4)

The relation between an adherent oxide generated by laser radiation and the pull-out adhesion was examined. In order to prepare a sample having no adherent oxide, a test specimen irradiated with laser radiation at a Q-switch frequency of 6 kHz was sufficiently washed using an ultrasonic cleaner to remove oxide micropowder. An average value of five samples was defined as the pull-out adhesion of the test specimen. The results are shown in Table 3. It was confirmed that the presence of an oxide contributed to the improvement in pull-out adhesion.

TABLE 3

| Sample | having adherent oxide | having no adherent oxide |
|---|---|---|
| Pull-out adhesion (Kg) | 32.1 | 15.2 |

(Experiment 5)

In each of test specimens (see FIG. 5) treated by the surface treating methods A, B, and C, the thickness of an oxide layer formed on the treated portion (projecting strip 14b) and the thickness of a natural oxide layer formed on the portions other than the treated portion were measured. A method for measuring the thickness is as follows: Firstly, the surface of the projecting strip 14b which had not been surface-treated was irradiated with laser radiation until an oxide layer with a relatively large thickness was formed. The projecting strip on which the oxide layer had been formed was cut off and the cross section was observed using a scanning electron microscope (SEM). In general, when the cross section of the projecting strip is observed using SEM, an oxide layer is viewed to exhibit a contrast to a metal layer. The thickness of the oxide layer was measured by making use of the contrast between the oxide layer and the metal layer, which was observed from a microphotograph of SEM.

Also, in this projecting strip, the same position as that where the thickness of the oxide layer had been measured was measured by Auger spectrum analysis. Specifically, a peak of oxygen was traced while the surface of the lead was etched using Ar ions and the point where the peak was saturated to a low value was defined as the boundary between the oxide layer and the metal layer. The conditions of Auger spectrum analysis was as follows: While the surface of the lead was etched using Ar ions provided with an accelerated voltage of 2 kV, electron beams were applied to the surface of the lead in the conditions of an accelerated voltage of 5 kV, a current of 100 nA, an angle of incidence of 30 degrees, and a spot diameter of several $\mu$m to measure etching time and the peak intensity of oxygen. The etching time required for an etching spot to reach the boundary was calibrated based on the result obtained from SEM to calculate the thickness of the oxide layer corresponding to a unit etching time.

Further, Auger spectrum analysis was performed on the surface of the projecting strip 14b of each of test specimens treated by the above treating processes in the aforementioned conditions. In the same manner as above, a peak of oxygen was traced while the surface of the strip was etched and the point where the peak was saturated to a low value was defined as the boundary of the oxide layer to measure etching time. The etching time was calibrated to calculate the thickness of the oxide layer formed on each of the projecting strips. In each of the projecting strips, the portion embedded in the plastic was subjected to Auger spectrum analysis in the same manner as above after the projecting strip was mechanically peeled from the plastic to expose the surface.

The surface roughness ($R_{max}$) of the treated portion in each of the test strips was measured using a surface roughness measuring meter (SURFCOM, manufactured by Tokyo Seimitsu Co., Ltd.). The pitch of the irregular portion was measured by observing the surface using SEM provided with an accelerated voltage of 15 kV after the projecting strip was mechanically peeled from the plastic at the position where the projecting strip was embedded in the plastic whereby the surface was exposed.

As is clear from Table 4, the treated portions of the test specimens A and C, which were irradiated with laser radiation, were formed with an oxide layer with a thickness greater than those formed on the portions other than the treated portions. These surfaces of the treated portions were also formed with an irregular portion. On the other hand, as for the test specimen B treated by sandblast, the pitch could not be detected, though the surface of the projecting strip was roughened. Therefore, it was determined that no irregular portion having cyclic irregularities was formed. From these results, it is considered that the oxide layer and the irregular portion which are formed by laser irradiation contribute to the moisture resistance of the lead (durable time in pressure cooker test).

The pitch of the irregular portion on the surface of the projecting strip of each of the test specimens A and C coincides with the interval of a spot on the surface of the projecting strip, the interval of a spot being calculated from the frequency of pulse laser radiation and the scanning velocity of laser radiation. Therefore, it is considered that an irregular portion formed from molten metal at the portion irradiated with pulse laser radiation has an effect on the improvement in the moisture resistance of the lead.

TABLE 4

| Surface treating method | A | B | C |
| --- | --- | --- | --- |
| Thickness of the oxide layer formed on the trated portions | 90 nm | <4 nm | 30 nm |
| Thickness of the natural oxide layer | <4 nm | <4 nm | <4 nm |
| $R_{max}$ | 8 µm | 0.5 µm | 3 µm |
| Pitch of the irregular portion | 33 µm | — | 17 µm |

Next, with regard to each of the test specimens, the projecting strip was mechanically peeled from the plastic to expose the surface of the above treated portions. Auger spectrum analysis was performed on the surface in the aforementioned conditions. In the same manner as above, a peak of oxygen was traced while the surface of the strip was etched using Ar ions and the point where the peak was saturated to a low value was defined as the boundary between the oxide layer and the metal. Using the etching time required for an etching spot to reach the boundary, the ratio of the thickness of an oxide layer formed on the treated portion to the thickness of an oxide layer formed on the untreated portion was calculated.

As a result of Auger spectrum analysis, in the test specimen A which had the best results in any of the pull-out adhesion, the thickness of the oxide layer formed on the treated portion, and the durable time in pressure cooker test, the ratio of the thickness of the surface oxide layer formed on the treated portion to the thickness of the natural oxide layer was within the range from 1.5 to 500 times.

In addition, oxide microparticles were further stuck to the surface oxide layer of each of the test specimens A and C. The particle diameter of the oxide microparticles was measured by observing the surface oxide layer by SEM provided with an accelerated voltage of 15 kV after the projecting strip was mechanically peeled from the plastic to expose the surface of the treated portion. The particle diameter of oxide microparticles formed on the surface of the test specimen A was 50 nm to 1 µm.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. A plastic package comprising:
    a plastic package body for storing a chip;
    a lead member having one end extending to the inside of said package body, the other end protruding from said package body, and an intermediate portion embedded in said package body, said one end being to be electrically connected with said chip; and
    an oxide layer formed on a part of the surface of said intermediate portion in said lead member so as to have a thickness greater than thicknesses of an oxide layer formed on the remainder part of said lead member.

2. A plastic package according to claim 1, wherein said oxide layer is composed of an oxide of at least one metal selected from the group consisting of a plurality of metal materials or a single metal material constituting said lead member.

3. A plastic package according to claim 1, wherein at least a part of said oxide layer has a thickness ranging from 5 to 500 nm.

4. A plastic package according to claim 1, wherein at least a part of said oxide layer has a thickness 1.5 to 500 times that of an oxide layer formed on the remainder part of said lead member.

5. A plastic package according to claim 2, wherein microparticles having a particle diameter of 10 nm to 2 µm are disposed on the surface of said oxide layer.

6. A plastic package according to claim 1, wherein said oxide layer is formed by irradiating the part of the surface of said intermediate portion in said lead member with laser radiation.

7. A plastic package according to claim 6, wherein said laser radiation has a wave length ranging from 0.8 to 1.5 µm.

8. A plastic package according to claim 6, wherein said laser radiation is a pulsed laser.

9. A plastic package according to claim 6, wherein said laser radiation is radiated from Q-switched Nd:YAG laser, having a wave length of 1.06 µm.

10. A plastic package comprising:
    a plastic package body for storing a chip;
    a lead member having one end extending to the inside of said package body, the other end protruding from said package body, and an intermediate portion embedded in said package body, said one end being to be electrically connected with said semiconductor chip; and
    an irregular portion having cyclical irregularities formed at a pitch of 10 to 100 µm on the surface of said intermediate portion of said lead member, the irregular portion having a length of 0.1 mm or more in a longitudinal direction of the lead member.

11. A plastic package according to claim 10, wherein the surface roughness of said irregular portion is from 1 to 100 µm in terms of $R_{max}$.

12. A plastic package according to claim 10, further comprising an oxide layer formed on the surface of said irregular portion, the oxide layer having a thickness of 5 to 500 nm.

13. A plastic package according to claim 10, wherein said irregular portion is formed by irradiating a part of said lead material with laser radiation.

14. A plastic package according to claim 13, wherein said laser radiation has a wave length ranging from 0.8 to 1.5 µm.

15. A plastic package according to claim 13, wherein said laser radiation is a pulsed laser.

16. A plastic package according to claim 13, wherein said laser radiation is radiated from Q-switched Nd:YAG laser, having a wave length of 1.06 µm.

17. A plastic package comprising:
    a plastic package body having a cavity for storing a chip;
    a lead member having one end extending to the inside of said cavity, the other end protruding from said package body, and an intermediate portion embedded in said package body, said one end being electrically connected with said chip; and
    an oxide layer formed on a part of the surface of said intermediate portion in said lead member so as to have a thickness greater than thicknesses of an oxide layer formed on the remainder part of said lead member.

18. A semiconductor device comprising a semiconductor chip stored in a plastic package of the type described in claim 1.

* * * * *